(12) United States Patent
Wang et al.

(10) Patent No.: US 11,024,206 B2
(45) Date of Patent: Jun. 1, 2021

(54) DISPLAY SYSTEM AND VEHICLE

(71) Applicant: BOE TECHNOLOGY GROUP CO., LTD., Beijing (CN)

(72) Inventors: Zifeng Wang, Beijing (CN); Yan Ren, Beijing (CN); Lei Cao, Beijing (CN); Hailan Jin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 341 days.

(21) Appl. No.: 16/083,270

(22) PCT Filed: Nov. 17, 2017

(86) PCT No.: PCT/CN2017/111544
§ 371 (c)(1),
(2) Date: Sep. 7, 2018

(87) PCT Pub. No.: WO2018/205540
PCT Pub. Date: Nov. 15, 2018

(65) Prior Publication Data
US 2019/0287442 A1   Sep. 19, 2019

(30) Foreign Application Priority Data

May 12, 2017   (CN) .......................... 201710335016.1

(51) Int. Cl.
*G09F 21/04*   (2006.01)
*B62J 99/00*   (2020.01)
(Continued)

(52) U.S. Cl.
CPC .............. *G09F 21/04* (2013.01); *B62J 99/00* (2013.01); *F16K 31/53* (2013.01); *G09F 9/30* (2013.01);
(Continued)

(58) Field of Classification Search
CPC ........... G09F 9/301; B62J 99/00; B62J 50/20; H05K 5/0017; H05K 5/0217
See application file for complete search history.

(56) References Cited

U.S. PATENT DOCUMENTS

| | | | |
|---|---|---|---|
| 8,009,421 B2* | 8/2011 | Misawa | G09F 9/301 361/679.55 |
| 8,376,581 B2* | 2/2013 | Auld | G09F 9/301 362/249.02 |

(Continued)

FOREIGN PATENT DOCUMENTS

| | | |
|---|---|---|
| CN | 201712741 U | 1/2011 |
| CN | 104149910 A | 11/2014 |

(Continued)

OTHER PUBLICATIONS

International Search Report and Written Opinion dated Feb. 22, 2018 from State Intellectual Property Office of the P.R. China.
(Continued)

*Primary Examiner* — Jacob D Knutson
*Assistant Examiner* — Michael R Stabley
(74) *Attorney, Agent, or Firm* — Dilworth & Barrese, LLP.; Michael J. Musella, Esq.

(57) ABSTRACT

A vehicle-mounted display system, including a display unit and a pressure control unit. The pressure control unit is configured to enable the display unit to expand or contract; the display unit is configured to carry out the expanding or the contracting based on control of the pressure control unit.

20 Claims, 4 Drawing Sheets

(51) Int. Cl.
*H05K 5/00* (2006.01)
*H05K 5/02* (2006.01)
*F16K 31/53* (2006.01)
*G09F 9/30* (2006.01)
*B62J 50/20* (2020.01)

(52) U.S. Cl.
CPC ......... *H05K 5/0017* (2013.01); *H05K 5/0217* (2013.01); *B62J 50/20* (2020.02); *G09F 9/301* (2013.01)

(56) References Cited

U.S. PATENT DOCUMENTS

| | | | | |
|---|---|---|---|---|
| 9,606,654 | B2* | 3/2017 | Li | G06F 3/017 |
| 9,786,247 | B2* | 10/2017 | Hong | G06F 1/1622 |
| 9,823,697 | B2* | 11/2017 | Hsu | G06F 1/1652 |
| 2006/0038745 | A1* | 2/2006 | Naksen | G06F 1/1637 |
| | | | | 345/30 |
| 2006/0209218 | A1 | 9/2006 | Lee et al. | |
| 2011/1093829 | | 8/2011 | Tsai et al. | |
| 2014/0362511 | A1 | 12/2014 | Deutsch | |
| 2018/0082615 | A1* | 3/2018 | Cheung | G09F 9/301 |

FOREIGN PATENT DOCUMENTS

| | | |
|---|---|---|
| CN | 205264275 U | 5/2016 |
| CN | 106205396 A | 12/2016 |
| DE | 102008030996 A1 | 12/2009 |

OTHER PUBLICATIONS

Extended European Search Report from European Patent Application 17909399.2 dated Dec. 18, 2020.

* cited by examiner

DISPLAY SYSTEM AND VEHICLE

FIELD OF THE INVENTION

Embodiments of the present disclosure relate to a display system and a vehicle including the display system.

TECHNICAL BACKGROUND

Bicycle is a kind of means of transportation that is convenient and a sports implement, and in the course of a bike ride, people are frequently confronted with such a situation that it is necessary to view a map or other information. If people use tools such as mobile phones to view information while riding, it is a great threat to the safety of cycling. In addition, if a rider makes an information inquiry after riding is interrupted, the experience of riding will also be affected, and the rider's time is wasted.

SUMMARY

An objective of embodiments of the present disclosure is to provide a display system and a vehicle including the display system.

According to at least one embodiment of this disclosure, a display system is provided. The display system comprises a display unit and a pressure control unit, the pressure control unit is configured to allow the display unit to switch between at least a first state and a second state, the first state is an expanded state; the second state is a contracted state. For example, the pressure control unit is configured to enable the display unit to expand or contract. The display unit is configured to carry out changeover of the states based on control of the pressure control unit. For example, the display unit is configured to carry out the expanding or the contracting.

For example, the display system includes a first mode and a second mode, in the first mode, the pressure control unit produces a pressure, under the pressure, the display unit is converted from the second state into the first state to display information; in the second mode, the pressure control unit releases the pressure, under which the display unit is converted from the first state into the second state so as to close down the information display.

For example, the pressure control unit includes a pressure generating component, the pressure generating component is located within a first frame tube at the front end of a pedal component of a vehicle; the pressure produced by the pressure generating component can act on the display unit to switch the display unit from the second state into the first state.

For example, the pressure generating component includes a transmission rod, one end of the transmission rod is connected with a gear in the pedal component, and rotation of the gear takes the transmission rod to move to produce pressure.

For example, the pressure generating component further includes an isolating component, the isolating component is movably arranged within the first frame tube, and divides the space enclosed in the first frame tube by the pressure generating component into a first space and a second space; wherein, the first space is near a flexible display screen of the display unit, and the second space is near the pedal component; the isolating component is connected with the other end of the transmission rod, and movement of the transmission rod takes the isolating component to move within the first frame tube, and squeezes the produced pressure from the second space to the first space.

For example, the isolating component includes a first valve, the transmission rod moves toward a first direction along with rotation of the gear to open the first valve; the transmission rod moves toward a second direction along with rotation of the gear to close the first valve, and the pressure produced by movement of the transmission rod squeezes from the second space to the first space through the first valve.

For example, a second valve is disposed at an edge of the first space far away from the second space, and in the case of the transmission rod moving toward a first direction along with rotation of the gear, the first valve is opened, and the second valve is closed; in the case of the transmission rod moves toward a second direction along with rotation of the gear, the first valve is closed, and the second valve is opened, and the pressure produced by movement of the transmission rod is transmitted from the first space to the display unit through the second valve.

For example, the first valve includes a first opening and a first cover at the first opening; the second valve includes a second opening and a second cover at the second opening, in the case of the transmission rod moving toward a first direction along with rotation of the gear, the first cover is opened, and the second cover is closed; in the case of the transmission rod moving toward a second direction along with rotation of the gear, the first cover is closed, and the second cover is opened, and the pressure produced by movement of the transmission rod squeezes from the second space to the first space via the first opening, and is transmitted from the first space to the display unit via the second valve.

For example, the pressure control unit includes a pressure adjusting component, the pressure adjusting component is located within the first frame tube, and is capable of adjusting the excess pressure produced by the pressure generating component.

For example, the pressure adjusting component includes a body possessing a certain space, a third opening and a fourth opening are provided on the body, and the gas produced by the pressure generating component enters into the space of the body from the third opening, the fourth opening contacts with the outside atmosphere, and the excess gas entering from the third opening is discharged from the fourth opening.

For example, the pressure adjusting component further includes a third valve located at the fourth opening, and in the case of gas entering from the third opening exceeding a first threshold, the third valve is opened, and the gas is discharged from the fourth opening.

For example, the pressure adjusting component further includes an elastic membrane and a linkage component that are located within the body, one end of the linkage component is connected with the elastic membrane, the third valve is connected with the other end of the linkage component, in the case of the gas exceeding the first threshold, the elastic membrane moves under the action of pressure of the gas, and takes the linkage component to move, and the linkage component brings the third valve to be opened.

For example, the elastic component includes a first spring and a second spring positioned above and below the elastic membrane, respectively, in the case of the elastic membrane moving, the first spring contracts, the second spring stretches to bring the third valve to be opened.

For example, further comprising a switch unit connected with the third valve, in the case of the switch unit being opened, the third valve is in a closed state, at least a part of gas produced by the pressure generating component flows to the display unit to switch the display unit from the second state into the first state; in the case of the switch unit being closed, the third valve is in an open state, gas produced by the pressure generating component is discharged from the fourth opening.

For example, the display unit includes a flexible display screen and an elastic air mattress attached to a rear housing of the flexible display screen, in a first mode, the pressure control unit produces pressure which acts to blow up the elastic air mattress, the elastic air mattress brings the flexible display screen to be converted from a second state into a first state to display information; in a second mode, the pressure control unit releases pressure, the elastic air mattress contracts, and brings the flexible display screen to be converted from the first state into the second state to close down the information display.

For example, the display unit is located within a second frame tube above a head of a vehicle, and in the first mode, the gas produced by the pressure control unit flows from the first frame tube into the second frame tube, to blow up the elastic air mattress.

For example, the second frame tube includes a fifth opening, in the case of the display unit being converted from a second state into a first state, the fifth opening of the second frame tube is opened, and the display unit is ejected from the second frame tube; in the case of the display unit is converted from the first state into the second state, the display unit rolls back into the second frame tube from the fifth opening.

For example, the display unit further includes a memory steel wire, the memory steel wire is arranged at the edge of the elastic air mattress.

For example, the display unit further includes a display driving component, and in the case of the flexible display screen being opened, the display driving component drives the flexible display screen to display information.

According to at least one embodiment of this disclosure, a vehicle is provided; the vehicle comprises the display system.

BRIEF DESCRIPTION OF THE DRAWINGS

To illustrate technical solutions in embodiments of the present disclosure more clearly, accompanied drawings necessary to be used in description of embodiments will be briefly introduced below. The accompanied drawings described below are merely related to exemplary embodiments of the present disclosure.

DESCRIPTION

Figure 1:
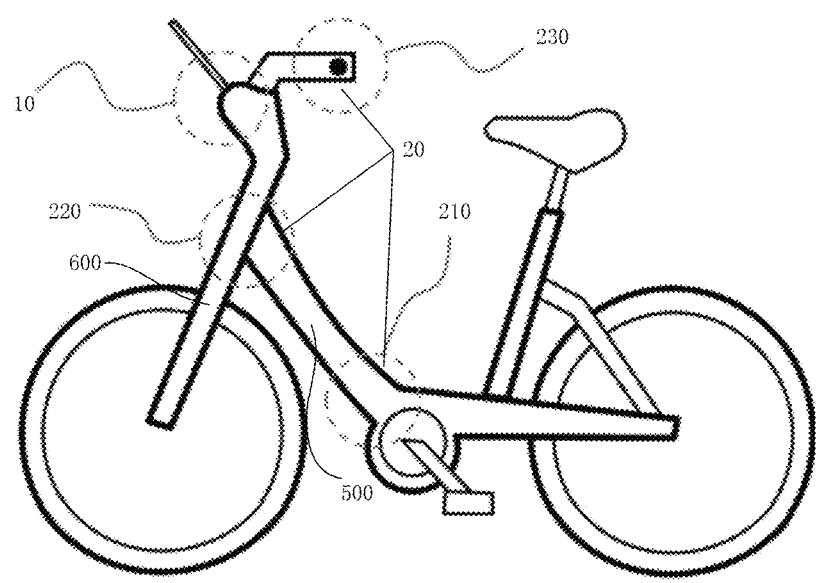
FIG. 1 is a structurally schematic view showing a bicycle according to an embodiment of the present disclosure.

Thereinafter, preferred embodiments of the present disclosure will be described in detail in connection with the accompanied drawings. It is to be noted that, in the specification and accompanied drawings, the same reference numerals are used to denote basically the same steps and elements, and repetitive explanation of these steps and elements will be omitted.

In order to make objectives, technical solutions and merits of embodiments of the present disclosure more clear, hereinafter, technical solutions of embodiments of the present disclosure will be clearly and fully described in combination with accompanied drawings of embodiments of the present disclosure. Apparently, the embodiments to be described are merely a part but not all of embodiments of the present disclosure. Every other embodiment, as would be obvious to those ordinarily skilled in the art without creative work on the basis of described embodiments of the present disclosure, comes within the protection scope of the present disclosure.

Unless otherwise defined, the technical terminology or scientific terminology used herein should have the same meaning as commonly understood by one of ordinary skill in the art to which this disclosure belongs. "First", "second" and the like used in specification and claims of the patent application of the present disclosure do not show any order, number or importance, but are only used to distinguish different constituent parts. Likewise, a term "a," "an," or the like does not indicate limitation in number, but specifies the presence of at least one.

In embodiments of the present disclosure, a vehicle may be any vehicle that travels by exerting power on it, such as, a motor vehicle, or a non-motor vehicle. For example, it is a bicycle, a tricycle, an electric vehicle, a motorcycle or the like. In embodiments of the present disclosure, relevant technical solutions will be described merely by taking bicycles as an example, based on the contents introduced in the present disclosure, those skilled in the art can know how to implement the same technical solution on other types of vehicle.

FIG. 1 is a structurally schematic view showing a bicycle according to an embodiment of the present disclosure. According to an example of the present disclosure, the display system may be a vehicle-mounted display system, such as, a display system for bicycles. Of course, the display system may also be used in other equipments or devices. In the present disclosure, introduction will be made by merely taking a vehicle-mounted display system as an example, it is conceivable by those skilled in the art to apply the display system to other equipments on the basis of the technical solutions of the present disclosure.

Referring to FIG. 1, on the bicycle, there is provided a vehicle-mounted display system, which includes a display unit 10 and a pressure control unit 20. The pressure control unit 20 may further include a pressure generating component 210 and a pressure adjusting component 220. Besides, the pressure control unit 20 may further include a switch unit 230, useful for users (e.g. riders) to open or close down the vehicle-mounted display system. For example, in order to facilitate the user to press switch while cycling, the switch unit 230 may be set on the left or right handle bar.

In addition, the bicycle includes a frame serving a supporting function, which is generally a hollowed, tubular structure. In an embodiment of the present disclosure, the vehicle-mounted display system may be arranged inside a frame tube. As shown in FIG. 1, the frame tube includes a first frame tube 500 and a second frame tube 600. The first frame tube 500 is such as a through tube including a pedal part. The second frame tube 600 is, such as, a through tube connected to an axis of a front wheel. The first frame tube 500 is connected with the second frame tube 600, and the tubes' inside is intercommunicated with each other. In embodiments of the present disclosure, as for the first frame tube 500 and/or the second frame tube 600, except the set opening, the rest may be a closed space.

In an embodiment of the present disclosure, the pressure control unit 20 is arranged inside the hollowed frame tube of the bicycle, and for example, it is arranged within the first frame tube 500 in the middle-lower section of the bicycle shown in FIG. 1. The display unit 10 may also be arranged inside the frame tube of the bicycle, such as, at the head of the bike shown in FIG. 1, in the middle of two handle bars within the second frame tube 600. The display unit 10 may be opened under the control of the pressure control unit 20, for display of information. For example, as shown in FIG. 1, it is useful for displaying information to the facing rider after opened, for example, map information, address information, and so on. Or alternatively, it may also be closed down under the control of the pressure control unit 20, so as to close down the information display. After it is closed down, it may be hidden in the second frame tube 600 of the bicycle.

The pressure control unit 20 can take control of change-over of the display unit 10 between a first state and a second state. The first state is such as an expanded state, and the second state is such as a contracted state. For example, the pressure control unit is configured to enable the display unit to expand or contract. The display unit 10 adopts a flexible display screen, which can be converted from a contracted state into an expanded state under the control of the pressure control unit 20, so as to display information to the user. For example, the display unit is configured to carry out the expanding or the contracting.

It can also be converted from an expanded state into a contracted state, so that the display unit closes down the information display.

For example, the vehicle-mounted display system may include two modes of usage, namely, a first mode and a second mode. In the first mode, the pressure control unit 20 may produce a pressure, and the pressure converts the display unit 10 from a contracted state into an expanded state, so that the display unit 10 displays information to user. While in the second mode, the pressure control unit 20 may release pressure, and the display unit 10 is converted from an expanded state into a contracted state, so that the display unit 10 closes down the information display.

In this way, the vehicle-mounted control system according to an embodiment of the present disclosure may not need to be supported by a bracket. According to the user's needs, the display unit is opened or closed down by pressure control. This avoids installation and disassembly of the bracket, and improves the rider's experience of riding.

Figure 2A:
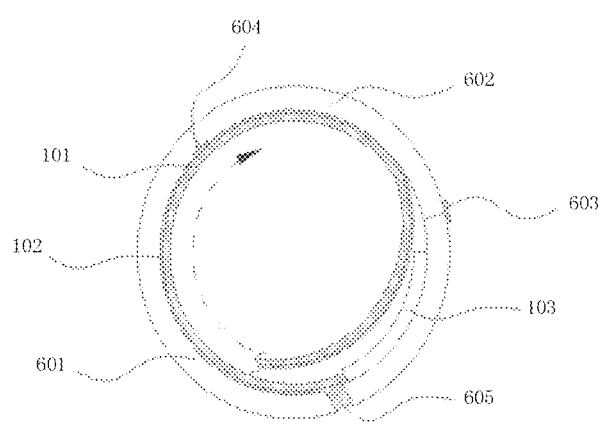
FIGS. 2a to 2b are structurally schematic views showing a display unit of a vehicle-mounted display system according to an embodiment of the present disclosure.
Figure 2B:
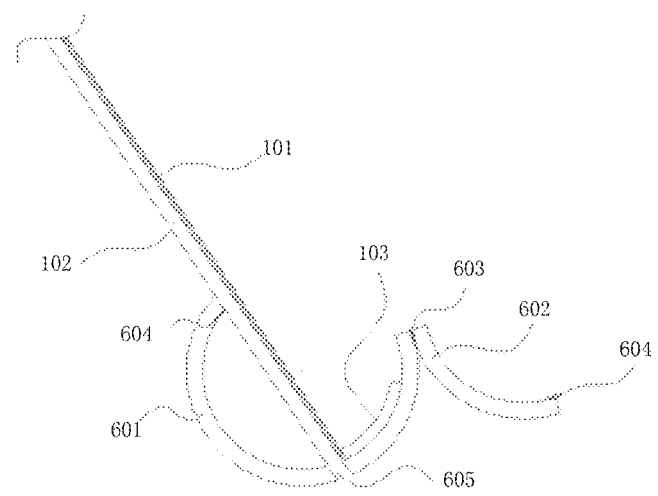

The display unit in the vehicle-mounted display system according to embodiments of the present disclosure will be introduced below. FIGS. 2a to 2b are structurally schematic views showing a display unit of a vehicle-mounted display system according to an embodiment of the present disclosure. Wherein, FIG. 2a is a structurally schematic view showing a display unit 10 in a closed state. FIG. 2b is a structurally schematic view showing the display unit 10 in an expanded state.

Referring to FIGS. 2a and 2b, the display screen of the display unit 10 may be a flexible display screen 101, and on the backside of the flexible display screen 101, there may be provided an elastic air mattress 102, which is attached to the rear housing of the flexible display screen 101. The flexible display screen 101, for example, may be made of ultra-thin organic electroluminescent diode (OLED) material. With a flexible display screen made of this material, as compared to an existing glass display screen, light reflection and other defects of display screen can be effectively avoided.

When the user does not use the information displayed on the display unit, the display unit 10, as shown in FIG. 2a, is in a closed state, that is, an unexpanded state, and thus it may be hidden in the second frame tube above the head of the bicycle.

When the user needs to open the display unit, the user may press a switch unit 230, so as to convert the vehicle-mounted display system from a non-working mode into a working mode. As a result, the display unit 10 is opened to display information to the user. After entering into the working mode, namely in the first mode, the pressure control unit 20 generates a pressure, and the pressure may go into the elastic air mattress 102 to blow up the elastic air mattress 102. The elastic air mattress 102 can bring the flexible display screen 101 to convert from a contracted state into an expanded state, so as to display information to the user. That is, it is converted from a closed state of FIG. 2a to an open state of FIG. 2b.

When the user has read through the display information of the display unit 10 and does not need to view the information any more, the user may press the switch unit 230 to close down the display unit 10, so that the vehicle-mounted display system is converted from the working mode into a non-working mode, namely, a second mode. In the second mode, the pressure control unit 20 releases the pressure, and the elastic air mattress 102 contracts, and brings the flexible display screen 101 to convert from an expanded state into a contracted state so as to close down the information display.

With aid of the display unit designed by the present disclosure, it is possible that the user is allowed to control the opening and closing of a display screen in the course of riding without the need of bracket and other component, and this greatly facilitates the user's use.

According to an example of the present disclosure, as shown in FIG. 1, the display unit 10 is located within the second frame tube 600 above the vehicle's head. When the vehicle-mounted display system enters into a working mode, namely, in a first mode, in order to inflate and blow up the elastic air mattress 102 in the display unit 10, the gas generated by the pressure control unit 20 may flow from a first frame tube 500 in the middle-lower section of the bicycle into the second frame tube 600, and then enter the elastic air mattress 102 from the second frame tube 600. Consequently, pressure is produced, and it makes the elastic air mattress be inflated.

According to an example of the present disclosure, on the second frame tube 600, there is provided an inflating opening 605, which is communicated with an inflation inlet of the elastic air mattress 102. When airflow within the second frame tube is increased, the airflow is filled into the inflation inlet of the elastic air mattress 102 via the inflating opening 605 so as to inflate the elastic air mattress 102.

According to an example of the present disclosure, on the second frame tube 600, there is provided a fifth opening. For example, as shown in FIG. 2b, in the place of the second frame tube 600 where the display unit 10 is mounted, there are provided a first section 601 and a second section 602. The first section 601 is such as a longer arc section, and the second section 602 is a shorter arc section. One end of the first section 601 and one end of the second section 602 may be connected by a connecting component 603 (e.g. a hinge). The other end of the first section 601 and the other end of the second section 602 may be engaged by a clasping structure 604. When the clasp 604 is clasped, as shown in FIG. 2a, the first section 601 and the second section 602 form a complete second frame tube. That is, in appearance, the second frame tube of the bicycle is a complete whole. When the clasp 604 is unclasped, as shown in FIG. 2b, the second section 602 bounces, and an arc-shaped opening (namely the fifth opening) is formed on the second frame tube 600.

For example, as the display unit 10 is converted from a contracted state into an expanded state, due to a pressure that results from the upward expansion of the display unit 10, the second section 602 on the second frame tube 600 breaks through the snap-fitting strength of the clasp 604 and bounces. As a result, the display unit 10 may be ejected from the arc-shaped opening of the first frame tube. While as the display unit is converted from an expanded state into a contracted state, the display unit 10 will roll back from the fifth opening into the second frame tube, and thus be hidden in the second frame tube, thereby the overall beauty of the bicycle is guaranteed.

After the display unit 10 rolls back into the fifth opening, the user may manually restore the second section 602 of the second frame tube 600. Alternatively, it is also possible to arrange a linking component for connecting the flexible display screen 101 and the second section 602 of the second frame tube 600. When the flexible display screen 101 rolls back into the second frame tube, it will bring the second section 602 to recover with aid of the linking component, so that the second section 602 can be snap-fitted with the first section 601.

According to an example of the present disclosure, the display unit 10 may further include a memory steel wire, which is arranged at the edge of the elastic air mattress 102. Thus, a faster and better rebound effect of the elastic air mattress 102 is achieved.

According to an example of the present disclosure, the display unit 10 may further include a display drive component 103, such as a video card, a microprocessor, or the like. When the flexible display screen is opened, the display drive component may drive the flexible display screen to display information.

Figure 3A:
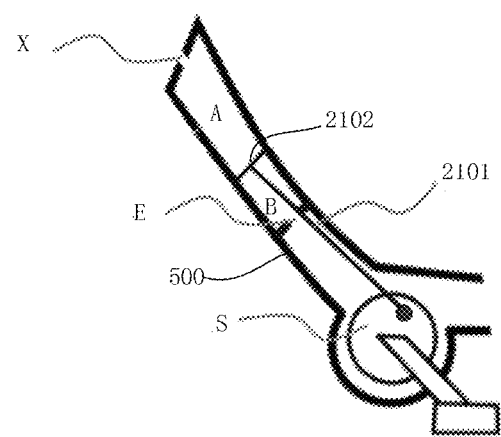
FIGS. 3a to 3b are structurally schematic views showing a pressure generating component of a vehicle-mounted display system according to an embodiment of the present disclosure.
Figure 3B:
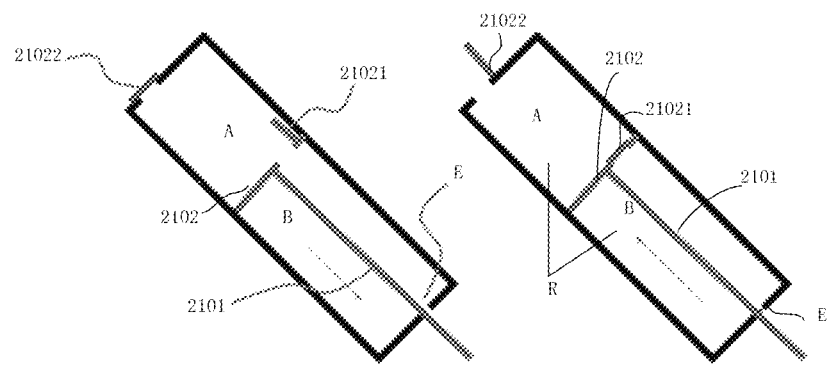

The pressure control component according to embodiments of the present disclosure will be further introduced below. Firstly, the pressure generating component in the pressure control component will be introduced. FIGS. 3a to 3b are structurally schematic views showing a pressure generating component of a vehicle-mounted display system according to an embodiment of the present disclosure. Wherein, FIG. 3a is a diagram showing the overall structure of a pressure generating component. FIG. 3b is a structural view showing the gas pressure change in the pressure generating component.

Referring to FIG. 3a, the pressure generating component 210 may be arranged within the first frame tube 500 at the front end of a vehicle pedal component. For example, it is possible to arrange the pressure generating component 210 in a part of frame tube at the front end of the pedal component. As such, the gas generated by the pressure generating component 210 can enter the second frame tube 600 along the first frame tube 500, and then further enter an elastic air mattress 102 on a rear housing of the flexible display screen. Consequently, the flexible display screen 101 is converted from a contracted state into an expanded state.

Referring to FIG. 3a, the pressure generating component 210 may include a transmission rod 2101, and one end of the transmission rod 2101 is connected with a gear S in the vehicle peal component. As such, rotation of the gear takes the transmission rod 2101 to move, and thus pressure may be produced within the first frame tube.

Referring to FIG. 3b, according to an example of the present disclosure, the pressure generating component 210 may enclose a pressure generating space R within the first frame tube 500, the pressure generating component 210 is rubber, plastic, metal or other material for example. Inlets and outlets are arranged at the edge of the space R. Referring to FIG. 3b, one end of the transmission rod 2101 passes through the pressure generating space via an inlet E, and the other end of it is connected with the gear S. In addition, the pressure generating component 210 may include an isolating component 2102, which may be such as a piston. The isolating component 2102 may be movably arranged within the pressure generating space R of the first frame tube. For example, the isolating component 2102 is connected with the other end of the transmission rod 2101, and movement of the transmission rod 2101 may take the isolation component 2102 to move in the space R. The isolating component 2102 divides the pressure generating space R into a first space A and a second space B. Wherein, the first space A is near the flexible display screen, and the second space B is near the pedal component. During riding, the gear S moves, and this takes the transmission rod 2101 to move. Since the inlet E is connected with the outside atmospheric pressure, and its pressure is basically the same as the atmospheric pressure, movement of the transmission rod 2101 will take the outside airflow to enter from the inlet E of the pressure generating space R, and to outflow from an outlet X. In addition, the transmission rod 2101 also takes the isolating component 2102 to move, so that pressure will be produced in the first frame tube 500.

In order to produce a greater pressure within the frame tube during riding of the bicycle, referring to FIG. 3b, the isolating component 2102 includes a first valve 21021, and at an edge of the first space A far away from the second space B, namely at the outlet X, there is provided a second valve 21022.

Referring the left figure of FIG. 3b, when the transmission rod 2101 moves downward in the direction of approaching toward the gear (the arrow direction) along with rotation of the gear S, the isolating component 2102 moves downward along with it. As such, the first space A becomes larger and the second space B becomes smaller. Owing to the fact that the space of the second space B becomes smaller and its internal pressure increases, the pressure functions to lift up the first valve 21021. While owing to the fact that the first space A becomes larger and its internal pressure decreased, the second valve 21022 is closed at this time. While as the first valve 21021 is open, the air pressure produced by movement of the transmission rod 2101 is extruded from the second space B to the first space A via the first valve.

Referring to the right figure of FIG. 3b, when the transmission rod 2101 moves upward in the direction of being far away from the gear (the arrow direction) along with rotation of the gear S, the isolating component 210 moves upward along with it. As such, the first space A becomes smaller, and the second space B becomes larger. While owing to the fact that the second space becomes larger and its internal pressure is reduced, the first valve 21021 is closed at this time. Since the space of the first space A becomes smaller and its internal pressure increases, the pressure functions to open the second valve 21022. When the second valve 21022 is open, the air pressure in the first space A flows from the first frame tube 500 to the second frame tube 600 via the second valve 21022.

According to an example of the present disclosure, the first valve 21021 may include a first opening and a first cover at the first opening; the second valve 21022 may include a second opening and a second cover at the second opening as well. When the transmission rod 2101 moves downward along with rotation of the gear S, the first cover is opened and the second cover is closed. When the transmission rod 2101 moves upward along with rotation of the gear S, the first cover is closed and the second cover is opened. As such, during operation of the vehicle, the transmission rod 2101 continues to move, the pressure produced by the movement squeezes from the second space B to the first space A via the first opening, and is transmitted from the first space A to the direction of the display unit 10 via the second opening. Consequently, the sufficient air pressure can be produced to open the flexible display screen 101 in the display unit 10.

Figure 4A:
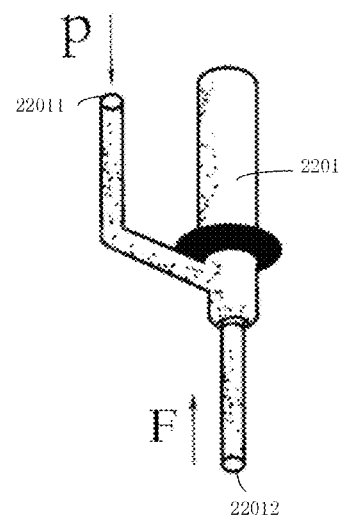
FIGS. 4a to 4b are structurally schematic views showing a pressure adjusting component of a vehicle-mounted display system according to an embodiment of the present disclosure.
Figure 4B:
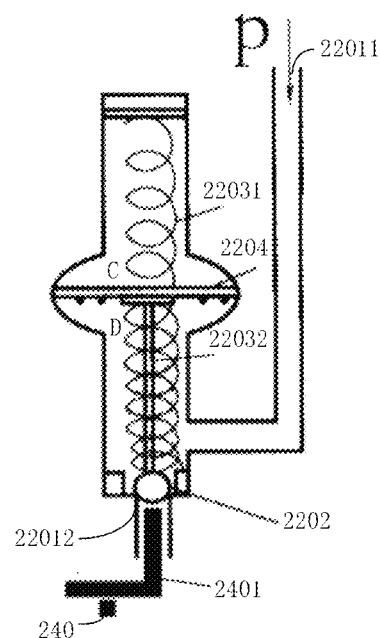

The pressure generating component 210 produces a great deal of air pressure. If the air pressure is large enough, there will be a potential safety hazard. Therefore a pressure adjusting component 220 is disposed to adjust the pressure come from the pressure generating component 210. The pressure adjusting component 220 in the pressure control unit 20 will be introduced below. FIGS. 4a and 4b is structurally schematic view showing a pressure adjusting component of a vehicle-mounted display system according to an embodiment of the present disclosure. Wherein, FIG. 4a shows the overall appearance of the pressure adjusting component 220. FIG. 4b shows the internal structure of the pressure adjusting component 220. The pressure adjusting component may also be arranged within a first frame tube 500, Alternatively, the pressure adjusting component may also be arranged at the junction of the first frame tube 500 and a second frame tube 600. For example, it is arranged in the place shown in FIG. 1. It may be arranged in other suitable position of the bicycle as well. The pressure adjusting component 220 can act to adjust the excess air pressure produced by the pressure generating component 210.

Referring to FIG. 4a, the pressure adjusting component 220 includes a body 2201 with a certain space, and the body is such as a cylindrical pipe. Of course, in order to adapt to frame tubes of the bicycle with different shapes, it may also be set to take such a shape that corresponds with the frame tube's shape, or a part of a frame tube is directly utilized as the body 2201. On the body 2201, there are provided a third opening 22011 and a fourth opening 22012. The gas P produced by the pressure generating component 210 may enter into the space of the body via the third opening 22011, and the fourth opening 22012 may contact with the external atmosphere F. thus, the excess gas entering from the third opening 22011 is discharged from the fourth opening 22012.

According to an example of the present disclosure, the pressure adjusting component 220 may further include a third valve 2202 that is located at the fourth opening 22012. When the gas exceeding a first threshold enters from the third opening 22011, the third valve 2202 will automatically open, so that the gas entering the body is discharged from the fourth opening 22012. Optionally, the third valve 2202 is such as a spherical valve, etc. The first threshold may be set according to volume of the body of the pressure adjusting component 220, and may also be set according to pressure level within the body after the potential safety hazard is evaluated.

Furthermore, the pressure adjusting component 220 may further include a linkage component 2203 and an elastic membrane 2204 within the body 2201. The linkage component 2203, for example, may be an elastic component 2203 (e.g. a spring) or a link rod. The elastic membrane may be located on a cross section inside the columnar body or the hollowed pipe, so that the space within the body 2201 is divided into a third space C and a fourth space D. But there is basically no flowing of airflow between the third space C and the fourth space D. Because of the blocking-up between the third space C and the fourth space D, the gas entering the body 2201 from the third opening 22011 firstly enters the fourth space D, and basically does not enter the third space C. In addition, the elastic membrane 2204 is connected to one end of the linkage component 2203, and the third valve 2202 is connected to the other end of the linkage component 2203. When the gas entering the body 2201 from the third opening 22011 exceeds the first threshold, the pressure in the fourth space D increases, and the elastic membrane 2204 moves upward in the vertical direction under the action of the gas pressure, and takes the linkage component 2203 to move upward. Consequently, the linkage component 2203 may take the third valve 2202 to move upward, and thus the third valve 2202 is opened. For example, the spherical valve lifts and departs from the fourth opening 22012, so that the fourth opening is opened, and the excess pressure produced by the pressure generating component may be released from the fourth opening 22012.

In addition, according to one example of the present disclosure, in order to avoid the case that performance of the pressure adjusting component 220 is influenced by damage of one elastic component 2203, there may be two of the elastic component 2203, such as a first spring 22031 and a second spring 22032. Referring to FIG. 4b, the first spring 22031 and the second spring 22032 may be located above and below the elastic membrane 2204, respectively, one end of the first spring 22031 and one end of the second spring 22032 are connected with the elastic membrane 2204 respectively. When the elastic membrane 2204 moves upward, the first spring 22031 contracts, and the second spring 22032 stretches, thereby taking the third valve 2202 to open. In this way, the excess gas produced by the pressure generating component may flow out from the fourth opening 22012.

According to an example of the present disclosure, the switch unit 240 of the vehicle-mounted display system may be arranged in the vicinity of the third valve 2202. The switch unit 240 is, such as a link rod structure shown in FIG. 4b. When the display unit is not used, the switch unit 240 is in a state of contacting the third valve 2202 and lifting up the third valve 2202, so that the valve is in an opened state all the time, and the fourth opening 22012 is in the open state. In this way, even if gas is produced within a frame tube by the pressure generating component 210 during riding, the gas will flow out from the fourth opening 22012, and no gas accumulation will be formed.

When a user needs to open the display unit to view information, the user presses the switch unit 240. As such, the link rod 2401 is separated from the third valve 2202 under the action of the user's pressure. Thus, the third valve 2202 closes the fourth opening, and the pressure generating component 210 may produce enough gas for opening the display unit 10. The gas flows to the display unit 10, so as to open the flexible display screen. Only when the pressure generating component produces excess pressure, the pressure adjusting component 230 adjusts the pressure as mentioned above, so as to make the third valve 2202 be opened properly, and this guarantees the balance of pressure in the frame tube.

While after the user has read through the display information and pressed the switch unit 240 to close the witch unit, the valve 2202 is in an opened state once more, and thus the excess gas produced by the pressure generating component can be discharged from the fourth opening 22012.

According to embodiments of the present disclosure, by means of taking control of the opening and closing of a display unit with a pressure control unit, without the need of providing a bracket or the like, the user is allowed to expediently view display information in the course of riding, and this improves the user's experience of riding.

It should be understood by those skilled in the art that, various modifications, combinations, partial combinations and substitutions can be made to the present disclosure depending on the design requirements and other factors, as long as they comes within the scope of the appended claims and their equivalents.

The present application claims priority of Chinese patent application No. 201710335016.1, filed on May 12, 2017, the content disclosed by which is incorporated in its entirety by reference herein to act as a part of the present application.

What is claimed is:

1. A display system, comprising a display unit and a pressure control unit,
   the pressure control unit is configured to enable the display unit to expand or contract;
   the display unit is configured to carry out the expanding or the contracting based on control of the pressure control unit;
   wherein the pressure control unit comprises a pressure generating component, the pressure generating component is located within a frame tube of a vehicle; and
   a pressure produced by the pressure generating component and capable of acting on the display unit to switch the display unit from a contracting state to an expanding state.

2. The system according to claim 1, wherein the pressure control unit produces a pressure, under the pressure, the display unit is converted from the contracting state into the expanding state to display information; or,
   the pressure control unit releases the pressure, and the display unit is converted from the expanding state into the contracting state to close down the information display.

3. The system according to claim 1, wherein the pressure generating component includes a transmission rod, one end of the transmission rod is connected with a gear in a pedal component, and rotation of the gear takes the transmission rod to move to produce pressure.

4. The system according to claim 3, wherein the frame tube of the vehicle comprises a first frame tube and a second frame tube, the pressure generating component is located in the first frame tube of the vehicle; the pressure generating component further includes an isolating component, the isolating component is movably arranged within the first frame tube, and divides the space enclosed in the first frame tube by the pressure generating component into a first space and a second space; the first space is near a flexible display screen of the display unit, and the second space is near the pedal component; and
   the isolating component is connected with the other end of the transmission rod, and movement of the transmission rod takes the isolating component to move within the first frame tube, and squeezes the produced pressure from the second space to the first space.

5. The system according to claim 4, wherein the isolating component includes a first valve, the transmission rod moves toward a first direction along with rotation of the gear to open the first valve; the transmission rod moves toward a second direction along with rotation of the gear to close the first valve, and the pressure produced by movement of the transmission rod squeezes from the second space to the first space through the first valve.

6. The system according to claim 5, wherein a second valve is disposed at an edge of the first space far away from the second space, and in the case of the transmission rod moving toward a first direction along with rotation of the gear, the first valve is opened, and the second valve is closed; in the case of the transmission rod moving toward a second direction along with rotation of the gear, the first valve is closed, and the second valve is opened, and the pressure produced by movement of the transmission rod is transmitted from the first space to the display unit through the second valve.

7. The system according to claim 6, wherein the first valve includes a first opening and a first cover at the first opening; the second valve includes a second opening and a second cover at the second opening, in the case of the transmission rod moving toward a first direction along with rotation of the gear, the first cover is opened, and the second cover is closed; in the case of the transmission rod moving toward a second direction along with rotation of the gear, the first cover is closed, and the second cover is opened, and the pressure produced by movement of the transmission rod squeezes from the second space to the first space via the first opening, and is transmitted from the first space to the display unit via the second valve.

8. The system according to claim 6, wherein the pressure control unit includes a pressure adjusting component, the pressure adjusting component is located within the first frame tube, and is capable of adjusting the excess pressure produced by the pressure generating component.

9. The system according to claim 8, wherein the pressure adjusting component includes a body possessing a certain space, a third opening and a fourth opening are provided on the body, and the gas produced by the pressure generating component enters into the space of the body from the third opening, the fourth opening contacts the outside atmosphere, and the excess gas entering from the third opening is discharged from the fourth opening.

10. The system according to claim 9, wherein the pressure adjusting component further includes a third valve located at the fourth opening, and in the case of gas entering from the third opening exceeding a first threshold, the third valve is opened, and the gas is discharged from the fourth opening.

11. The system according to claim 10, wherein the pressure adjusting component further includes an elastic membrane and a linkage component that are located within the body, one end of the linkage component is connected with the elastic membrane, the third valve is connected with the other end of the linkage component, in the case of the gas exceeding the first threshold, the elastic membrane moves under the action of pressure of the gas, and takes the linkage component to move, and the linkage component brings the third valve to be opened.

12. The system according to claim 11, wherein the elastic component includes a first spring and a second spring positioned above and below the elastic membrane, respectively, in the case of the elastic membrane moving, the first spring contracts, the second spring stretches to bring the third valve to be opened.

13. The system according to claim 10, further comprising a switch unit connected with the third valve, in the case of the switch unit being opened, the third valve is in a closed state, at least a part of gas produced by the pressure generating component flows to the display unit to switch the display unit from the contracting state into the expanding state; in the case of the switch unit being closed, the third valve is in an open state, gas produced by the pressure generating component is discharged from the fourth opening.

14. The system according to claim 4, wherein the display unit includes a flexible display screen and an elastic air mattress attached to a rear housing of the flexible display screen,
- the pressure control unit produces pressure which acts to blow up the elastic air mattress, the elastic air mattress brings the flexible display screen to be converted from the contracting state into the expanding state to display information; or
- the pressure control unit releases pressure, the elastic air mattress contracts, and brings the flexible display screen to be converted from the expanding state into the contracting state to close down the information display.

15. The system according to claim 14, wherein the display unit is located within a second frame tube above a head of a vehicle, and the gas produced by the pressure control unit flows from the first frame tube into the second frame tube, to blow up the elastic air mattress.

16. The system according to claim 15, wherein the second frame tube includes a fifth opening, in the case of the display unit being converted from the contracting state into the expanding state, the fifth opening of the second frame tube is opened, and the display unit is ejected from the second frame tube; and in the case of the display unit being converted from the expanding state into the contracting state, the display unit rolls back into the second frame tube from the fifth opening.

17. The system according to claim 14, wherein the display unit further includes a memory steel wire, the memory steel wire is arranged at the edge of the elastic air mattress.

18. The system according to claim 14, wherein the display unit further includes a display driving component, and in the case of the flexible display screen being opened, the display driving component drives the flexible display screen to display information.

19. A vehicle, comprising a display system wherein the display system comprises:
- a display unit and a pressure control unit,
- the pressure control unit is configured to enable the display unit to expand or contract;
- the display unit is configured to carry out the expanding or the contracting based on control of the pressure control unit;
- wherein the pressure control unit comprises a pressure generating component, the pressure generating component is located within a frame tube of a vehicle; and
- a pressure produced by the pressure generating component and capable of acting on the display unit to switch the display unit from a contracting state to a expanding state.

20. The vehicle according to claim 19, wherein the pressure control unit produces a pressure, under the pressure, the display unit is converted from the contracting state into the expanding state to display information; or,
- the pressure control unit releases the pressure, and the display unit is converted from the expanding state into the contracting state to close down the information display.

* * * * *